(12) United States Patent
Takami

(10) Patent No.: US 7,531,472 B2
(45) Date of Patent: May 12, 2009

(54) NANOFIBER AND METHOD OF MANUFACTURING NANOFIBER

(75) Inventor: Tomohide Takami, Tokyo (JP)

(73) Assignee: Visionarts, Inc., Tokyo (JP)

( * ) Notice: Subject to any disclaimer, the term of this patent is extended or adjusted under 35 U.S.C. 154(b) by 959 days.

(21) Appl. No.: 10/726,370

(22) Filed: Dec. 3, 2003

(65) Prior Publication Data

US 2004/0244677 A1   Dec. 9, 2004

Related U.S. Application Data

(62) Division of application No. 09/871,029, filed on May 31, 2001, now abandoned.

(51) Int. Cl.
*C30B 9/00* (2006.01)
(52) U.S. Cl. .............................. 501/35; 117/12; 428/605
(58) Field of Classification Search ................... 117/12; 501/35; 428/605
See application file for complete search history.

(56) References Cited

U.S. PATENT DOCUMENTS 5,381,753 A * 1/1995 Okajima et al. ................ 117/12
5,858,862 A * 1/1999 Westwater et al. .......... 438/503

* cited by examiner

*Primary Examiner*—Robert M Kunemund
*Assistant Examiner*—Matthew J Song
(74) *Attorney, Agent, or Firm*—Woodcock Washburn LLP

(57) ABSTRACT

A method of manufacturing nanofibers which use self-organization which has a process of placing silicon microcrystal grains comprising the same element as the substrate on the surface of a substrate, a process of heating the previously noted substrate in a vacuum until the surface of the substrate reaches a melting temperature whereby, the surface of the previously noted substrate is a crystal face and the method of manufacturing nanofibers causes numerous nanowires to grow due to elements supplied from the substrate in the previously noted heating process by causing surface segregation to occur in the crystal faces which placed microcrystal grains causing nanofiber having a stem shaped structure.

9 Claims, 3 Drawing Sheets

NANOFIBER AND METHOD OF MANUFACTURING NANOFIBER

REFERENCE TO RELATED APPLICATIONS

This is a divisional patent application of copending application Ser. No. 09/871,029, filed May 31, 2001, entitled "NANOFIBER AND METHOD OF MANUFACTURING NANOFIBER," which claimed foreign priority from Japanese Application No. 2001-009587 filed Jan. 18, 2001. The aforementioned application(s) are hereby incorporated herein by reference.

BACKGROUND OF THE INVENTION

1. Field of the Invention

The invention pertains to the field of microstructures. More particularly, the invention pertains to a nanofiber and a method of manufacturing a nanofiber, particularly a method of manufacturing nanofiber formed using a substrate.

2. Description of Related Art

Since the discovery of carbon nanotubes as microstructures of an order of several nanometer ($10^{-9}$ m), microstructures such as those of silicon (Si) and Germanium (Ge), etc., which had already been discovered have been attracting attention once again in recent years. Previously known metallic microstructures are the nanostructures of such things as bar-shaped silicon crystals, folded silicon whiskers, cone-shaped germanium whiskers and Gallium Arsenide (GaAs) whiskers.

These nanotubes and nanostructures have many industrial applications such as in emitter materials and materials for hyperfine devices and they are expected to be important material to support the emerging "nanotechnology."

According to the previously noted articles, previously known nanostructures of such things as silicon and germanium which become semiconductors are manufactured using vapor deposition liquid phase solid phase (Vapor-Liquid-Solid, hereafter referred to as VLS). In addition, a method of manufacturing silicon nanowire with laser abrasion with semiconductor materials containing metals has been developed recently.

However, control of orientation of growth of nanowire manufactured with these methods is difficult. This nanowire becomes a wool-shaped structure, and it is difficult to manufacture nanofiber configured from numerous nanowires following particular axial directions. Because of this they had the disadvantage that it is difficult to obtain nanofibers with suitable configurations for material to be used in microelectronic devices.

On the other hand, methods of manufacturing orientation controlled nanofiber have been developed in recent years, for example, carbon nanotubes oriented on silicon carbide. These utilized the chemical decomposition reaction on the surface of a SiC wafer and when the SiO gas molecules generated in conjunction with the oxidation of the wafer surface bubble, the crystalline structure of the residual carbon changes and is reconfigured as a carbon nanotube film. However, this method produces many carbon nanotubes like "frost columns" and though they form a film, this method is based on the idea of eliminating silicon atoms from a substrate and not for causing carbon nanotubes to form on a substrate. In addition, this is a method for manufacturing over a wide area with mass-production in mind, and it is difficult to conceive of controlling manufacturing closely so that nanotubes can be made into fiber in desired units. Thus, even though orientation can be controlled somewhat this has the disadvantage that is it not something which would suggest a method for manufacturing nanofibers which have a desired diameter and length.

SUMMARY OF THE INVENTION

The purpose of this invention is to improve upon these faults of the prior art technology, particularly to provide nanofiber configured from numerous nanowires grown in a uniform direction, and a method of manufacturing these nanofibers.

In order to achieve the previously noted purpose, the invention provides a method of manufacturing nanofibers which uses self-organization—a process of placing silicon microcrystal grains comprising the same element as a substrate on the surface of the substrate, and heating the previously noted substrate in a vacuum until the surface of the substrate reaches a melting temperature. The surface of the substrate is a crystal face, and in the previously noted heating process the method causes numerous nanowires to grow due to elements supplied from the substrate, by causing surface segregation to occur in the crystal faces on which were placed microcrystal grains. This produces a nanofiber having a stem shaped structure.

Here, "crystal face" refers to a uniform atom plane in which atoms are orderly lined up and which is described in crystallography by Miller indices.

With the present invention, by making silicon microcrystal grains the kernels for growth, one can specify places where nanowires will be caused to grow due to self-organization, can line up nearly uniformly the direction that nanowires will grow due to self-organization, and can manufacture nanofibers comprising numerous nanowires oriented in a specific axial direction.

In another embodiment of the method of the invention, a metal such as gold, but in any case different from the substrate, is deposited on the surface by a process of vapor deposition. The metal layer may be a monolayer. The deposition is done after the silicon microcrystal grains were placed on the surface, but before the step of heating. Thus, the vapor deposition of the metal is performed on the crystal face at least where the previously noted silicon microcrystal grains are not placed.

With this invention the growth of nanowires can be accelerated because a metal, functions as a surfactant. Gold not only functions as a surfactant, but also functions to eliminate such things as oxides and carbides, etc., that adhere to the crystal face of a substrate, and controls and curbs the generation of such things as oxides. Thus, the gold layer can decrease the factors that influence the direction which nanowires grow and can improve the uniformity of the direction of such growth.

The invention may also include a heat dissipating step which lowers substrate temperature after the heating process, and then further heat the material after the heat dissipating step, thereby forming joint portions in the nanofiber.

The nanofiber produced by method of the invention comprises numerous silicon nanowires which are oriented and bundled in the same direction, and provided with a space between nanowires so that the nanofiber will have a stylus shaped cross-sectional configuration.

A nanofiber with a high aspect ratio can be realized with the present invention because it is configured from nanowires with uniform direction.

The nanofiber may also be formed with a joint portion shaped like a constriction where the diameter is smaller. Joint portions manifest a binding effect which binds nanowires as nanofibers with this invention.

The invention also teaches a method of manufacturing nanofibers which use self-organization, using the steps of vapor depositing a monolayer of gold on the surface of a substrate; and heating the substrate in a vacuum until the surface of the substrate reaches a melting temperature. This causes the gold to vaporize and numerous nanowires to grow due to elements supplied from the substrate, causing nanofiber having a stem shaped structure to form.

The retention of such things as oxides on the substrate surface at the time of self organization of nanowires which become hindrances when nanofiber is formed can be curbed and restrained with this invention.

DETAILED DESCRIPTION OF THE INVENTION

The present invention will be explained in the following, referring in this description to FIGS. 1 through 4.

Figure 1A:
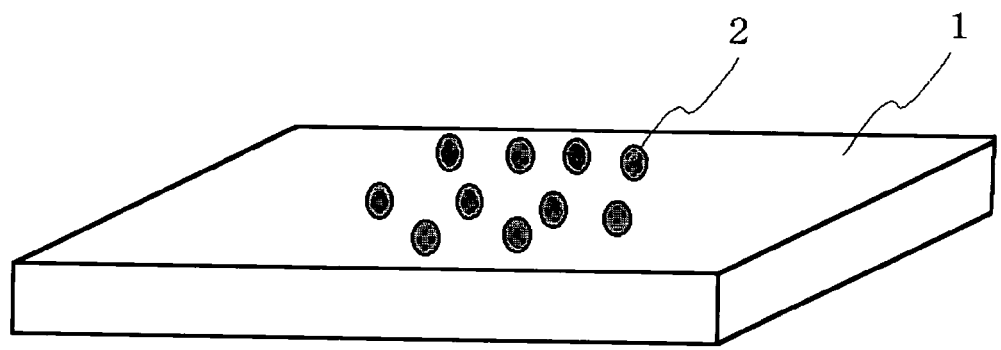
FIGS. 1a to 1c are abbreviated oblique view drawings of the steps in an embodiment of the method of manufacturing nanofibers of this invention.
Figure 1B:
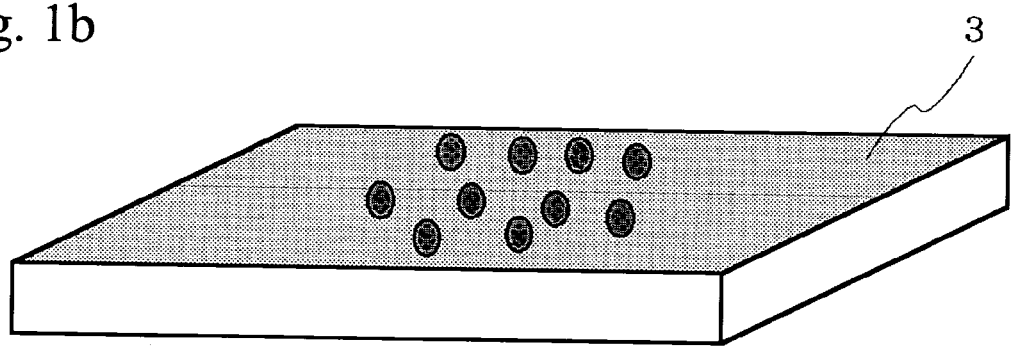
Figure 1C:
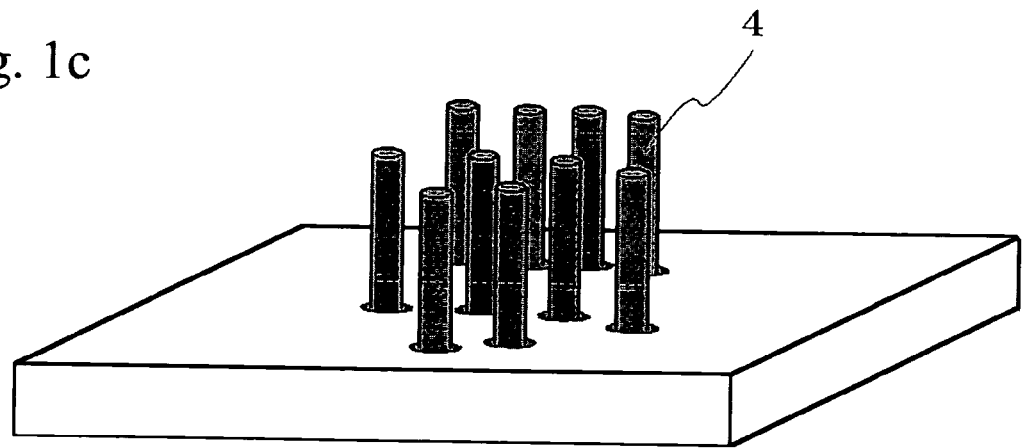

FIGS. 1a-1c are abbreviated oblique view drawings of the steps of the method of manufacturing nanofibers of this invention. In FIGS. 1a-1c, substrate 1 causes nanowires to grow and form nanofiber 4, and provides a crystalline surface which is configured from the same element as nanofiber 4 which is to be manufactured.

The first step in the method of manufacturing nanofibers of this invention (FIG. 1a) is placing microcrystal grains 2, made of the same element as substrate 1, on the surface of substrate 1.

The second step (FIG. 1b) is heating substrate 1 to a temperature where the surface of substrate 1 melts, forming an orderly arranged crystal face.

In the heating process (FIG. 1c) numerous nanowires are caused to grow by virtue of elements supplied from the surface area melted of substrate 1 by causing surface segregation to occur in the crystal faces on which were placed microcrystal grains, causing nanofibers 4 having a stem-shaped structure to form.

This method of manufacturing was suggested from the phenomenon of materials of a different type such as impurities that exist in crystals segregating on the interfaces of crystals when three dimensional crystals are heated. That is to say, forming crystalline interfaces only in areas where microcrystal grains 2 are placed by placing microcrystal grains 2 on the surface of this substrate 1 when the surface of substrate 1 is arranged so that it will be a crystal face with atoms arranged in an orderly fashion as the first stage. By heating substrate 1 so that it reaches a temperature where the substrate surface melts, surface segregation is generated in the crystal interface causing elements located in the surface of substrate 1 to concentrate in areas where microcrystal grains 2 exist. Then elements made fluid by melting are supplied to nanowire 5 (FIGS. 2 and 3) which is growing by self-organization and ultimately congeal at the tip 5a (FIG. 3) of nanowire 5. Because of this, the direction that nanowire 5 projects from the will follow direction (111).

Here, self-organization refers to organization maintaining given conditions by controlling factors which endeavor to develop a structure and factors which endeavor to restrict its development. In the method of manufacturing described earlier, we set the factor endeavoring to develop structure as the furnishing to the microcrystal grains 2 of elements constituting substrate 1 induced in surface segregation in the previously noted heating process. The action of elements constituting substrate 1 to maintain equilibrium positions was selected as the factor endeavoring to restrict development, for example, the action to maintain uniform distance between adjacent elements. These factors can be controlled by discontinuing heating. Another factor is the given conditions that microcrystal grains 2 congeal in the area placed.

In addition, because such things as point defects, which do not exist in an ideal solid, exist on the surface of substrate 1, there was also the possibility that nanowire 5 might form with these point defects as the growth kernel. However, point defects are very weak as factors inducing the generation of surface segregation and since the location where they exist cannot be controlled they are not practical. Because of this, as described earlier, by placing microcrystal grains 2 on the crystal face side of substrate 1, this causes local crystal grain boundaries to form as factors inducing surface segregation.

The previously noted method of manufacturing will be described in greater detail, with reference to FIGS. 2 and 3 and a specific embodiment of the invention. At the time of manufacturing, the material of substrate 1 causing nanowire 5 to grow is preferably silicon monocrystals (hereafter referred to as silicon substrate). Here the silicon substrate 1 would be a size with a surface area of 20 mm×5 mm. In addition the surface of this silicon substrate 1 was processed so that the arrangement of silicon crystals would be surface (111). Finally, we used silicon microcrystal grains which were constituted with the same elements as silicon substrate 1 for the microcrystal grains 2 that would be the growth kernels of nanofiber 4.

The placement process, vapor deposition process and heat process will be explained respectively in the following using FIGS. 1a-1c.

As FIG. 1 a shows, silicon microcrystal grains 2 were placed in the places where silicon nanofibers 4 were to grow on the (111) crystal face of silicon substrate 1. Here it is possible to control the diameter and cross-sectional configuration of the silicon nanofibers that will grow with the size of the silicon microcrystal grain 2 that becomes the growth kernel. For example, the size of silicon microcrystal grain 2 and the diameter of silicon nanofiber 4 become nearly equal and the cross-sectional configuration of silicon nanofiber 4 easily approximates the cross-sectional configuration of silicon microcrystal grain 2. Incidentally, the number of silicon nanowires 5 per unit cross sectional area comprising silicon nanofiber 4 normally depends on temperature and is not influenced by the size of silicon microcrystal grain 2 or the diameter of silicon nanofiber 4.

Since the heating of silicon substrate 1 is conducted in a vacuum, a silicon substrate 1 which has had the previously noted silicon microcrystal grain 2 placed is put in a vacuum chamber. When silicon substrate 1 is introduced into the vacuum the atmosphere inside the chamber is air. Then, after the silicon substrate has been introduced into the chamber the pressure in the vacuum chamber is reduced until it reaches an ultra high vacuum (UHV) which is less than $1 \times 10^{-7}$ Pa.

Here, the vacuum pressure inside the vacuum chamber, assuming that the molecules of residual gases such as carbon (C) in the interior of the chamber adhere to the surface of the substrate, will be at least $1 \times 10^{-4}$ Pa or less so that it will not cover all of the (111) face of silicon substrate 1. For example, this is because if it is several Torr (1 Torr is approximately $1\times10^2$ Pa) there will be residual carbon, SiC and oxides will form on the surface of substrate 1, possibly becoming factors hindering the self-organization of silicon nanowire 5.

This is not restricted to a procedure in which a silicon substrate 1 is introduced into a vacuum chamber for heating after silicon microcrystal grains 2 have been placed on silicon substrate 1. Needless to say, one may also use a device that can place silicon microcrystal grains 2 on a silicon substrate 1 in a heating device and then create a vacuum after introducing the silicon substrate in the heating device.

In this embodiment, a process is provided which vapor deposits metal 3 comprising an element which differs from silicon microcrystal grains 2 on the surface of a silicon substrate 1 on which silicon microcrystal grains 2 have been placed in a vacuum prior to heating silicon substrate 1. Here, the vapor deposition of metal 3 is done at least on a crystal face on which silicon microcrystal grains 2 have not been placed.

To be more specific, prior to the process of heating silicon substrate 1 metal 3 is vapor deposited on the crystal face of a silicon substrate 1 and this metal 3 acts as a surfactant and a vapor deposition process for growing silicon fiber nanofiber 4 is provided. Here a surfactant refers to a material furnished when a certain material is furnished to a surface which is an object to be controlled and this material furnished controls the state of the surface by spreading over the surface. By vapor deposition of a metal which is a surfactant it is possible to accelerate the surface segregation of silicon elements in the vicinity of an interface when heated, and here it is the a crystal face of silicon substrate 1.

In this embodiment gold (Au) was used for the metal vapor deposited on silicon substrate 1. A monolayer of gold was vapor deposited and as will be discussed later, the vapor deposited gold was caused to evaporate in a heating process causing numerous nanowires 5 to grow due to elements supplied from a substrate, forming a nanofiber 4 having a stem shaped structure. The amount deposited was confirmed by observation of the formation of a 6×6 structure on the surface using Reflection high-energy electron diffraction (RHEED).

The reason gold was selected as the metal to be vapor deposited was not only because of its feature as a surfactant. It was because it manifested features that would clean the crystal face such as eliminating residual carbon adhering to the (111) face of the silicon substrate and the suppressing or preventing the formation of oxides by causing the gold to evaporate. Thus, it can suppress such things as oxides etc. which become hindrances when forming silicon nanowire 5 from forming as a residue on the surface of the substrate when self-organizing silicon nanowire 5.

The reason for choosing a monolayer was because when thicker than a monolayer a solid phase reaction with silicon substrate 1 would occur, the gold would move and become a solid solution with the silicon substrate 1. That is to say because when normal vacuum vapor deposition is done with the gold, the vapor deposited gold, after it is adsorbed to the (111) face of the silicon substrate, gets into the interior of the silicon substrate so that it has significantly inferior device properties compared to the original substrate. Thus since satisfactory substrate properties cannot be achieved with gold in solid solution, this must be avoided and we therefore made a monolayer.

Here a metal that vaporizes when the silicon substrate 1 is heated in a vacuum, that is to say; one that has a boiling point or sublimation point that is lower than the silicon substrate 1 in a vacuum may be selected. For example, besides gold silver may be used but from the aspect of cleaning gold is most suitable.

FIG. 1c shows the heating process. Silicon substrate 1 is heated by passing an electric current of 10 A through it. It is heated for 200 minutes at 1000° C. This is done for the following reasons. The surface of silicon will melt at approximately 800° C. in a vacuum and it will melt entirely when 1350° C. is exceeded. On the other hand, gold 3 which is vapor deposited on the (111) face of silicon substrate 1 will begin to melt at 800° C. in a vacuum if the previously noted solid phase reaction has not occurred and will vaporize at 1000° C. A solid phase reaction with the gold will not occur at this time since gold was vapor deposited in a monolayer as previously noted and after it has acted as a surfactant it vaporizes. From the above, the vapor deposited gold is caused to evaporate and we set the heating temperature as 1000° C. as a temperature that will cause only the surface area of silicon substrate 1 to melt.

The temperature of the surface of silicon substrate 1 was measured with an infrared radiation temperature gauge because silicon substrate 1 was in a vacuum chamber, and a method of maintaining a uniform heating temperature was adopted based on the results of this measurement. Then by heating, the self organization of silicon nanowire 5 was stimulated and caused to grow, causing silicon nanofiber 4 to form from numerous silicon nanowires 5. The maximum of the vacuum pressure at the time of heating was $6\times10^{-5}$ Pa.

Figure 2:
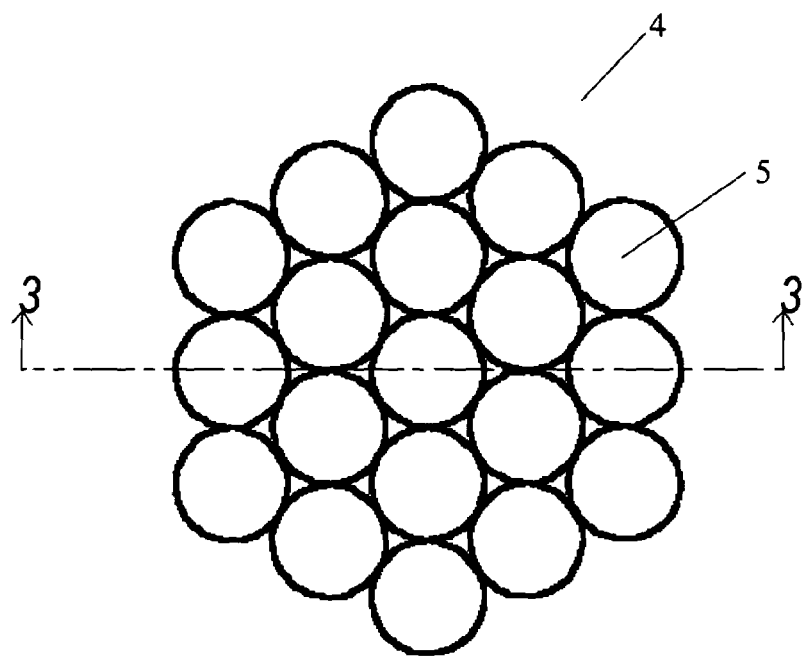
FIG. 2 is an abbreviated cross-section of a silicon nanofiber formed from silicon wire.
Figure 3:
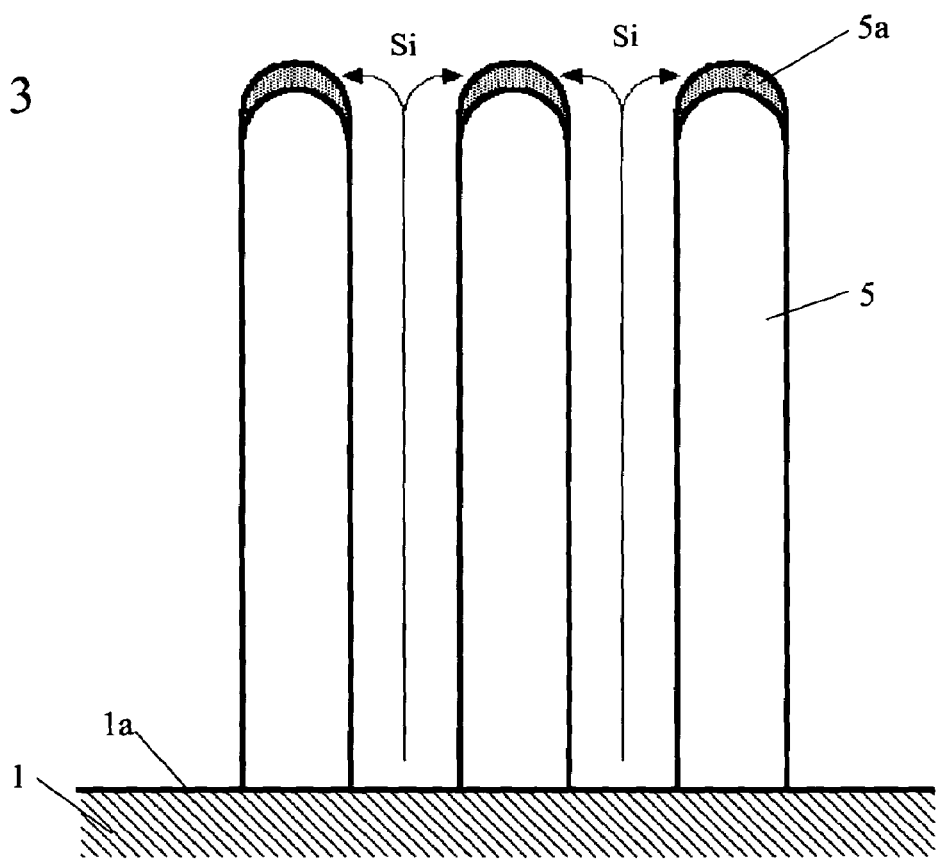
FIG. 3 is an abbreviated drawing showing vertical cross section of a silicon nanofiber along the line 3-3 in FIG. 2

FIGS. 2 and 3 are abbreviated type drawings showing silicon nanowires formed in the previously noted heating process. FIG. 2 is an abbreviated drawing showing a cross-section of a silicon nanofiber formed from silicon wire. FIG. 3 is an abbreviated drawing showing vertical cross section of a silicon nanofiber seen from the direction of 3-3 of FIG. 2.

As previously noted a silicon nanofiber 4 forms in the portion where silicon microcrystal grain 2 have been placed, corresponding to the diameter of those silicon microcrystal grain 2. At this time numerous silicon nanowires 5 are formed adjacent to each other as is shown in FIG. 2.

As FIG. 3 shows, while the surface 1a of silicon substrate 1 melts due to heating, this liquefied silicon rises due to the capillary action between silicon wires 5. After this liquefied silicon reaches the tip 5a of silicon wire 5 it congeals at tip 5a. Silicon nanowires 5 grow due to the repetition of this process and in its turn silicon nanofiber 4 forms. By manufacturing in this way numerous nanowires 5 are prepared from silicon, these nanowires 5 go in the same direct direction, aggregate in a bundle and nanofiber 4 having a structure provided with gaps between nanowires 5 so that its cross-sectional configuration is stem shaped is obtained.

Then since silicon nanofiber 4 grows corresponding to duration of heating time, the heating process is continued until the silicon fiber 4 grows to the desired length. This heating process is discontinued by stopping the flow of electrical current through silicon substrate 1. When the flow of electrical current is stopped after the current flow has stopped the temperature drops from approximately 130° C. to 120° C. in 1 second and to approximately 50° C. in a minute.

In one embodiment, a heat dissipating step is added which lowers the temperature of the substrate after the previously noted heating process, and then a further heating step was done after this heat dissipating process. To be more specific, after heating for 200 minutes as previously noted, the flow of electric current is discontinued as the heat releasing process and then the silicon substrate is once again heated continuously. The substrate was allowed it to sit and heat to dissipate for 15 minutes after discontinuing heating. The vacuum pressure at this time was $5 \times 10^{-7}$ Pa. Then the substrate was again heated for 60 minutes. The vacuum pressure at the conclusion of the period of heating was $4 \times 10^{-6}$ Pa.

Figure 4:
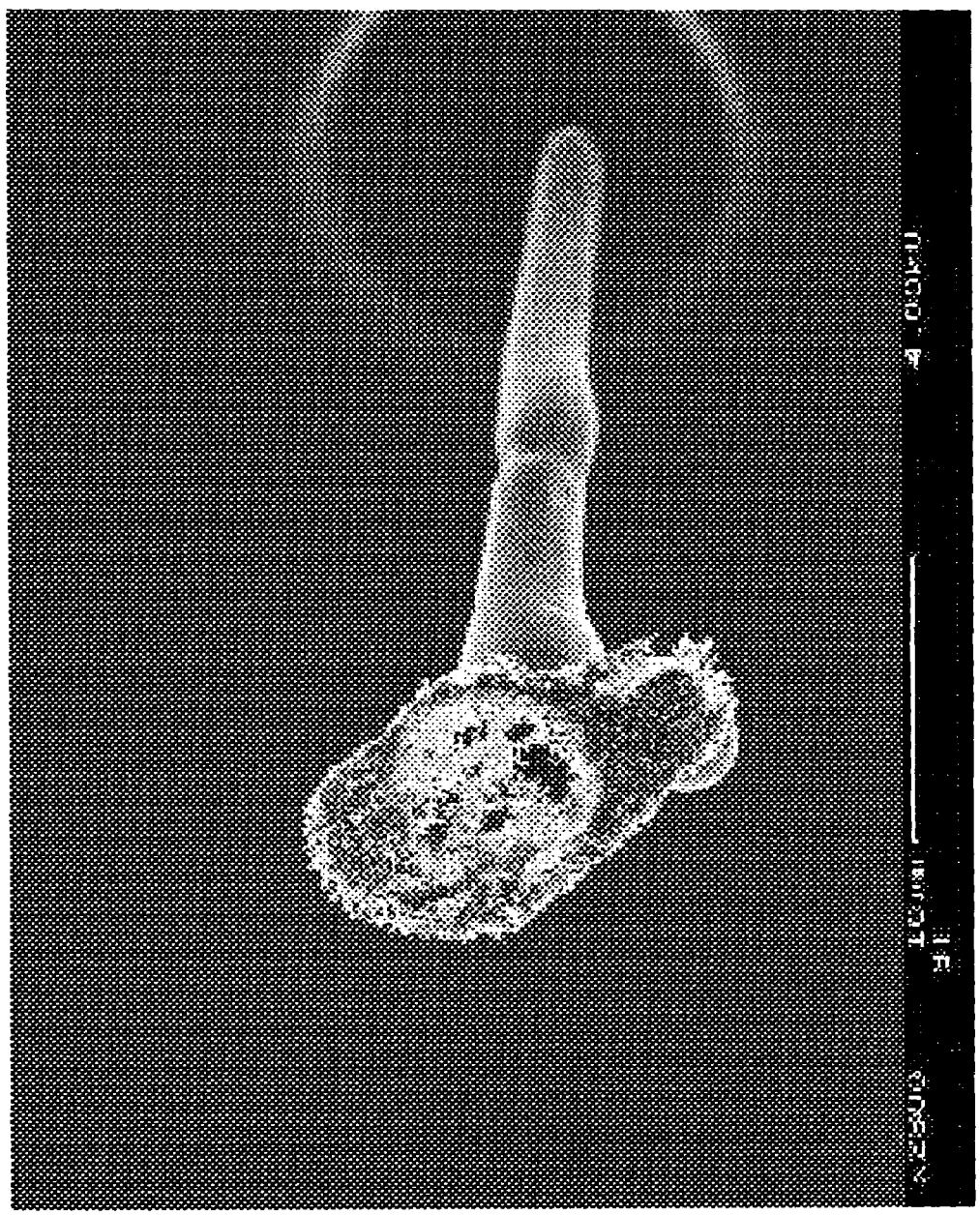
FIG. 4 is a photograph taken with an electron microscope showing a silicon nanofiber

FIG. 4 shows a photograph taken with an electron microscope of silicon nanofiber 4 obtained when a heat releasing process is provided after a heating process and then another heating process is provided. When the heating is interrupted by the heat releasing period, the diameter of silicon nanofiber 4 will be configured with small joint. When one does not want this joint to form the silicon substrate 1 is removed from the vacuum chamber after the heat releasing process. The ring shape that is seen in FIG. 3 is the interface between the areas of nanofiber 4 to which surface silicon was supplied and the areas to which it was not supplied in conjunction with melting.

What functions as the binder which binds numerous silicon nanowires 5 and makes silicon nanofiber 4 are the silicon nanowires 5 in the peripheral portion and they achieve this by mutually melting or congealing. In addition to this, by making the previously noted joint portion, this binding effect is enhanced and strength improved.

While the vacuum pressure in each process in the previously noted embodiment differed, it would be desirable, if possible, to make this uniform.

Because this invention is configured and functions as previously noted, it is possible to specify the places where nanowires will form from self-organization by using microcrystal grains for growth kernels, make the direction of growth due to self-organization of nanowires uniform and manufacture nanofibers comprised of numerous nanowires oriented a specific axial direction.

In addition it is possible to accelerate the growth of nanowire with the invention noted in claim 2 because vapor deposited metal functions as a surfactant.

Further, with the invention noted in claims 3 and 4, vapor deposited gold not only functions as a surfactant, since it also functions to eliminate such things as oxides and carbides etc. that adhere to the crystal face of a substrate and controls and curbs the generation of such things as oxides, it can decrease the factors that influence the direction which nanowires grow and can improve the uniformity of the direction of such growth.

With the invention noted in claim 5 joint portions in the nanofiber can be formed where desired.

A nanofiber with a high aspect ration can be realized with the invention noted in claim 6 because it is configured from nanowires with uniform direction.

Joint portions manifest a binding effect which binds nanowires as nanofibers with invention noted in claim 7.

The retention of such things as oxides on the substrate surface at the time of self organization of nanowires which become hindrances when nanofiber is formed can be curbed and restrained with the invention of claim and a nanofiber comprising nanowires with good directionality can be provided.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

TABLE OF REFERENCE NUMBERS 1 silicon substrate
1a surface of silicon substrate crystal
2 silicon microcrystal grain
3 metal
4 silicon nanofiber
5 silicon nanowire
5a tip of silicon nanowire

What is claimed is:

1. A nanofiber comprised of numerous nanowires, comprising silicon which is oriented and is bundled in a same direction as said nanowires, provided with a space between nanowires, such that the nanofiber has a stem shaped cross-sectional configuration.

2. The nanofiber of claim 1, having a joint portion shaped like a constriction where a diameter is smaller.

3. A nanofiber, comprising:
    a plurality of silicon nanowires oriented along a single axis,
        a portion of the nanofiber forming a joint aligned with the axis, the joint having a diameter less than that of the portions of the nanofiber preceding and following the joint.

4. The nanofiber of claim 3, wherein the nanowires are produced by heating silicon microcrystal grains placed on the surface of a silicon substrate.

5. The nanofiber of claim 4, wherein the diameter of the nanofiber is approximately equivalent to the size of the microcrystal grain.

6. The nanofiber of claim 3, wherein the nanowires are produced by heating silicon microcrystal grains placed on the surface of a silicon substrate, the grains and substrate having been coated by a layer of vapor deposited gold.

7. The nanofiber of claim 4 or 6, wherein the heating takes place in a vacuum.

8. The nanofiber of claim 7, wherein the atmosphere in the vacuum is initially air.

9. The nanofiber of claim 4 or 6, wherein the joint is formed by interrupting the heating to allow a dissipating period, followed by further heating.

* * * * *